(12) United States Patent
Hasper et al.

(10) Patent No.: US 7,077,614 B1
(45) Date of Patent: Jul. 18, 2006

(54) SORTING/STORAGE DEVICE FOR WAFERS AND METHOD FOR HANDLING THEREOF

(75) Inventors: Albert Hasper, Meppel (NL); Sebastiaan Eliza Nooten, Bilthoven (NL); Menso Hendriks, Soest (NL)

(73) Assignee: ASM International N.V., Bilthoven (NL)

( * ) Notice: Subject to any disclaimer, the term of this patent is extended or adjusted under 35 U.S.C. 154(b) by 507 days.

(21) Appl. No.: 09/807,580

(22) PCT Filed: Sep. 21, 1999

(86) PCT No.: PCT/NL99/00583

§ 371 (c)(1),
(2), (4) Date: Apr. 13, 2001

(87) PCT Pub. No.: WO00/22653

PCT Pub. Date: Apr. 20, 2000

(30) Foreign Application Priority Data

Oct. 14, 1998 (NL) .................................. 1010317

(51) Int. Cl.
*H01L 21/677* (2006.01)
*B65H 1/00* (2006.01)

(52) U.S. Cl. ....................................... 414/217; 414/805

(58) Field of Classification Search ................ 414/217, 414/222, 223, 937, 805
See application file for complete search history.

(56) References Cited

U.S. PATENT DOCUMENTS

| | | | |
|---|---|---|---|
| 4,501,527 A | 2/1985 | Jacoby et al. | |
| 4,722,298 A | 2/1988 | Rubin et al. | |
| 4,770,590 A * | 9/1988 | Hugues et al. | 414/172 |
| 4,775,281 A * | 10/1988 | Prentakis | 118/500 |
| 4,776,744 A | 10/1988 | Stonestreet et al. | |
| 4,867,629 A * | 9/1989 | Iwasawa et al. | 211/163 |
| 4,917,556 A * | 4/1990 | Stark et al. | 198/394 |
| 5,178,639 A | 1/1993 | Nishi | |
| 5,193,969 A * | 3/1993 | Rush et al. | 118/500 |
| 5,310,339 A | 5/1994 | Ushikawa | |
| 5,388,945 A * | 2/1995 | Garric et al. | 414/217.1 |
| 5,407,449 A | 4/1995 | Zinger | |
| 5,474,410 A * | 12/1995 | Ozawa et al. | 118/719 |
| 5,562,383 A * | 10/1996 | Iwai et al. | 414/217 |
| 5,611,448 A | 3/1997 | Chen | |
| 5,788,458 A | 8/1998 | Bonora et al. | |
| 5,826,129 A * | 10/1998 | Hasebe et al. | 396/611 |
| 5,863,170 A | 1/1999 | Boitnott et al. | |
| 6,079,927 A * | 6/2000 | Muka | 414/217 |
| 6,139,239 A | 10/2000 | Snijders | |
| 6,164,894 A * | 12/2000 | Cheng | 414/216 |
| 6,213,708 B1 * | 4/2001 | Allen | 414/627 |
| 6,283,692 B1 * | 9/2001 | Perlov et al. | 414/222.01 |

(Continued)

FOREIGN PATENT DOCUMENTS

EP  0 238 751  9/1987

(Continued)

*Primary Examiner*—Eileen D. Lillis
*Assistant Examiner*—Charles A. Fox
(74) *Attorney, Agent, or Firm*—Knobbe, Martens, Olson & Bear, LLP

(57) ABSTRACT

Sorting/storage device for wafers. A sorting device is provided in which at least two cassettes containing wafers may be present and the wafers are moved from one cassette to the other cassette or vice versa. If appropriate, a measuring station may be present in the sorting device. In the immediate vicinity of the sorting device, the cassettes are stored in a magazine which is designed for this purpose and the cassettes are moved using a handling device for cassettes.

5 Claims, 3 Drawing Sheets

U.S. PATENT DOCUMENTS 6,343,239 B1 * 1/2002 Toda et al. .................. 700/121

FOREIGN PATENT DOCUMENTS

| | | |
|---|---|---|
| EP | 0 399 616 | 11/1990 |
| EP | 0 506 045 | 9/1992 |
| GB | 2 199 011 | 6/1988 |
| WO | WO 91/042313 | 4/1991 |
| WO | WO 98/38672 | 9/1998 |
| WO | WO 98/43283 | 10/1998 |
| WO | WO 99/01894 | 1/1999 |
| WO | WO 99/18603 | 4/1999 |

* cited by examiner

SORTING/STORAGE DEVICE FOR WAFERS AND METHOD FOR HANDLING THEREOF

BACKGROUND OF THE INVENTION

1. Field of the Invention

The present invention relates to a device for sorting wafers.

2. Description of the Related Art

Such a sort device is generally known in the prior art. If wafers are being treated batchwise, it is customary to include test wafers in a batch as well as end wafers wherein because they are used as "fill" in the batch, the quality of treatment of these wafers is lower due to the position in the treatment device, and these wafers cannot be used further, or can only be used further after they have been treated. If a batch of wafers comprises, for example, 100 wafers, they are fed in a number of cassettes to the appropriate treatment device, such as a furnace. Normally, such cassettes contain approximately twenty-five wafers, so that in such a case approximately four wafer cassettes are fed to the furnace. A number of these cassettes are filled only with "product" wafers. Moreover, a number of cassettes contain test wafers and the end wafers described above.

In addition to the sorting device, there are normally a separate storage device for cassettes and one or more separate measuring stations for carrying out measurements. This means that in the prior art three or more separate housings are present, each separately provided with a (wafer- or cassette-)handling device and a particle-free environment.

The wafers are handled in the sorting device and in the measuring stations in a particularly particle-free environment. Higher demands are placed on this environment than on a clean room in which wafers are transported in closed pods. From the moment at which the transport pod is opened and the cassette containing wafers is removed therefrom until the moment at which the cassette containing wafers is placed back in the transport pod and the transport pod is closed, this particularly particle-free environment has to be maintained. By providing the pod around the wafer cassette with a standardized door (SMIF, FOUP) and placing the cassette with this door against a wall of the sorting device with a closable opening and simultaneously opening cassette door and wall opening, it is possible to achieve a highly effective separation between clean room and wafer-sorting chamber. As a result, the demands which are imposed on the clean room can be of a low level, with a corresponding saving in the costs, while in the limited volume of the sorting device itself it is possible to maintain an environment which satisfies the most stringent of materials requirements. It is also possible to provide the environment of the sorting device with an inert gas, such as nitrogen. The same applies to the measuring station. There too, the wafers are handled in a particularly particle-free environment. Each sorting station and each measuring station must be provided with a lock mechanism. The storage of wafers in the closed cassettes can take place under less stringent clean-room conditions.

U.S. Pat. No. 4,776,744, from which the preamble of claim 1 is known, discloses a device for sorting wafers. A turn-table is present, having several blades on which an indexer is provided for holding and moving two cassettes. The blades can be moved below a wafer gripper for removal and introduction of wafers out and in the cassettes.

SUMMARY OF THE INVENTION

The object of the present invention is to provide a sorting/storage/measuring device which is easier and less expensive to produce and in which the surface area required for the device can be limited without, reducing the throughout capacity. In addition, the flexibility is to be enhanced. In one embodiment, the device for sorting wafers stored in cassettes includes, among others, a housing, a wafer handling device arranged in a chamber to be sealed off with respect to the housing, a part for receiving cassettes arranged in the housing and separated from the chamber by a partition, a store for closable cassettes arranged in the housing, and a handling device for closable cassettes arranged in the housing.

As a result, the sorting options are considerably increased, due to the fact that all the cassettes in the storage device are available to the sorting device. In addition, the necessary measurements can also be carried out during sorting without the need for transportation to a separate measuring station. Consequently, the number of handling operations decreases and the capacity of the device can be increased while reducing the surface area required. If the wafers are supplied and stored in cassettes in pods provided with a standard door (SMIF, FOUP), fewer lock mechanisms are required than with the three or more separate housings according to the prior art. If certain types of wafer are always present in a specific cassette, it is possible, by changing cassettes of this nature into a different cassette which is present in the sorting device, to assemble a batch as desired. Naturally, it is also possible to arrange different types of wafers in a storage cassette, so that exchange in the sorting device is less frequent.

It is possible for the sorting device to deal with more than two cassettes at a time.

According to an advantageous embodiment of the invention, the chamber in which the sorting is carried out comprises a measuring station or a measuring station is arranged in functional relationship with the wafer handling device. Preferably this measuring station is provided in the space wherein sorting is realised or a measuring station is provided adjacent thereto. Such a measuring station may, for example, be designed to test layer thickness of the treated wafers, to measure amount of undesirable foreign particles which are present on/in the wafers and the like.

The cassette-handling device is able to move the cassettes from the insertion position to the store or to a turntable. The turntable moves the cassette into the correct position for the lock mechanism via which the cassette is placed in active connection with the wafer-handling robot.

The store for cassettes may comprise any structure which is known in the prior art, such as a rotatable magazine.

The invention also relates to a method for assembling a (part of a) batch of wafers which is to be fed to a treatment device for wafers, comprising placing at least two cassettes containing wafers in active connection with a wafer-handling device and using the said wafer-handling device to carry out a sorting operation by moving wafers from one cassette to the other and vice versa. According to the invention, this method is characterized in that at least one of the said cassettes is from a cassette store, the said cassettes being moved from the said store to the sorting station in a housing.

According to an advantageous embodiment of this method, the wafer is subjected to a measurement during the sorting operation. "During" is also understood to encompass immediately before or immediately after the sorting operation.

The invention will be explained in more detail below with reference to a structure according to the prior art and an exemplary embodiment according to the invention. In the drawing:

DETAILED DESCRIPTION OF THE PREFERRED EMBODIMENTS

Figure 1:
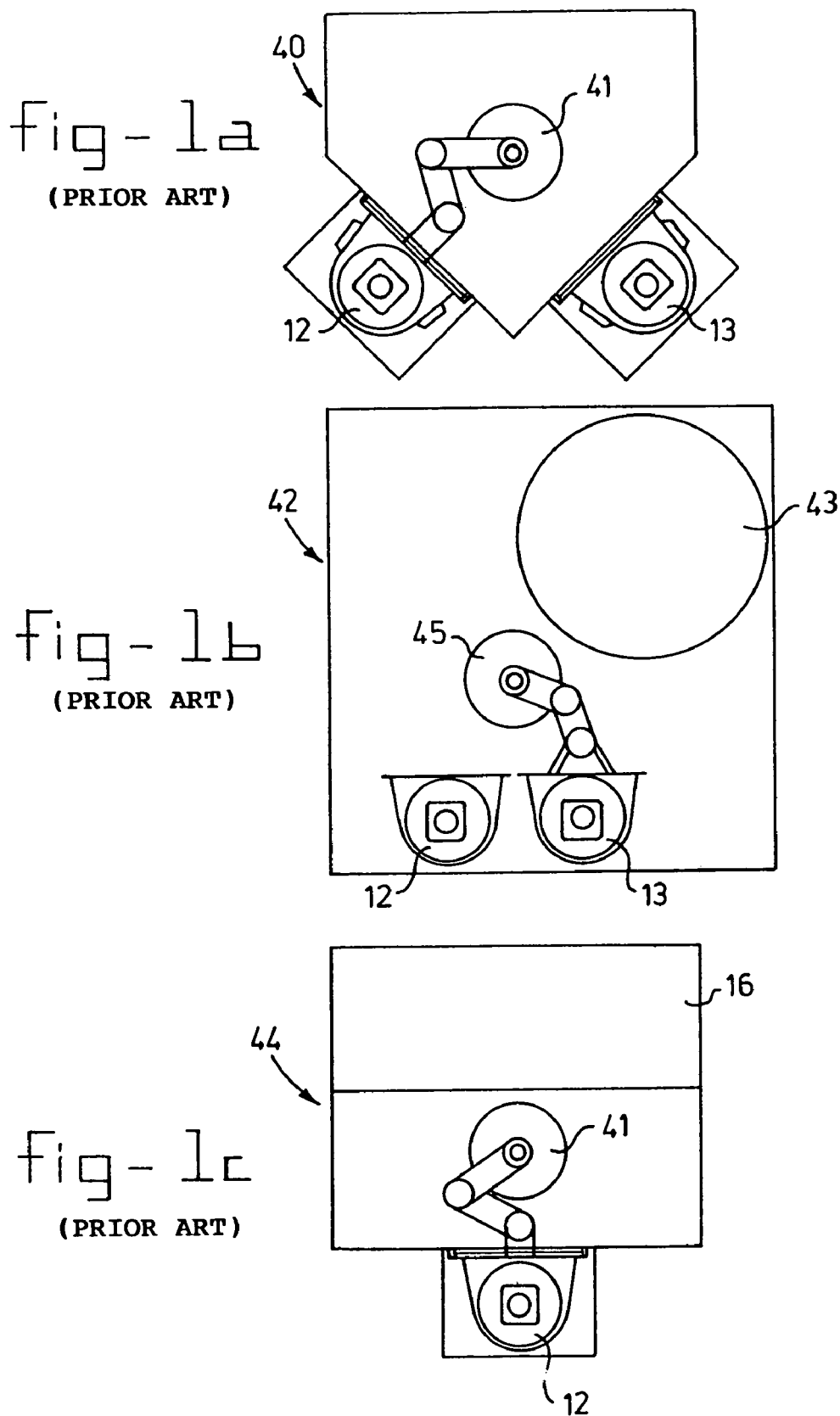
FIGS. 1a–c very diagrammatically show a number of devices according to the prior art.

In FIG. 1a, 40 denotes a sorting device which comprises a part (depicted highly diagrammatically) in which the cassettes 12 and 13 are arranged and a device for handling wafers which is denoted by a circle 41. Using this device, wafers, for example, are removed from cassette 12 and placed in cassette 13 in any desired order.

FIG. 1b shows a storage device 42. A store is denoted by 43 and a cassette-handling robot is denoted by 45. Using cassette-handling robot, cassettes 12, 13 are moved from the insertion position into store 43.

FIG. 1c shows a measuring station 44 with a diagrammatically depicted measuring cell 45. Wafers from the cassette 12 are subjected to a specific measurement in measuring cell 16.

To carry out a treatment in, for example, a furnace, such as a deposition process on a wafer, firstly, if required, measurements are carried out on test wafers in one or more measuring stations 44, for example the number of dust particles present before the treatment is measured. Then, a batch is assembled in device 40. Cassettes 12 containing different wafers which are required for his purpose come from store 42. After the appropriate treatment has been carried out, the wafers are sorted again in station 40 and are stored in station 42. The test wafers are measured in one or more measuring stations 44.

Transport between the various stations takes place in the cassettes 12, 13 and is taken care of by various operators or by a cassette-transporting system.

Figure 2:
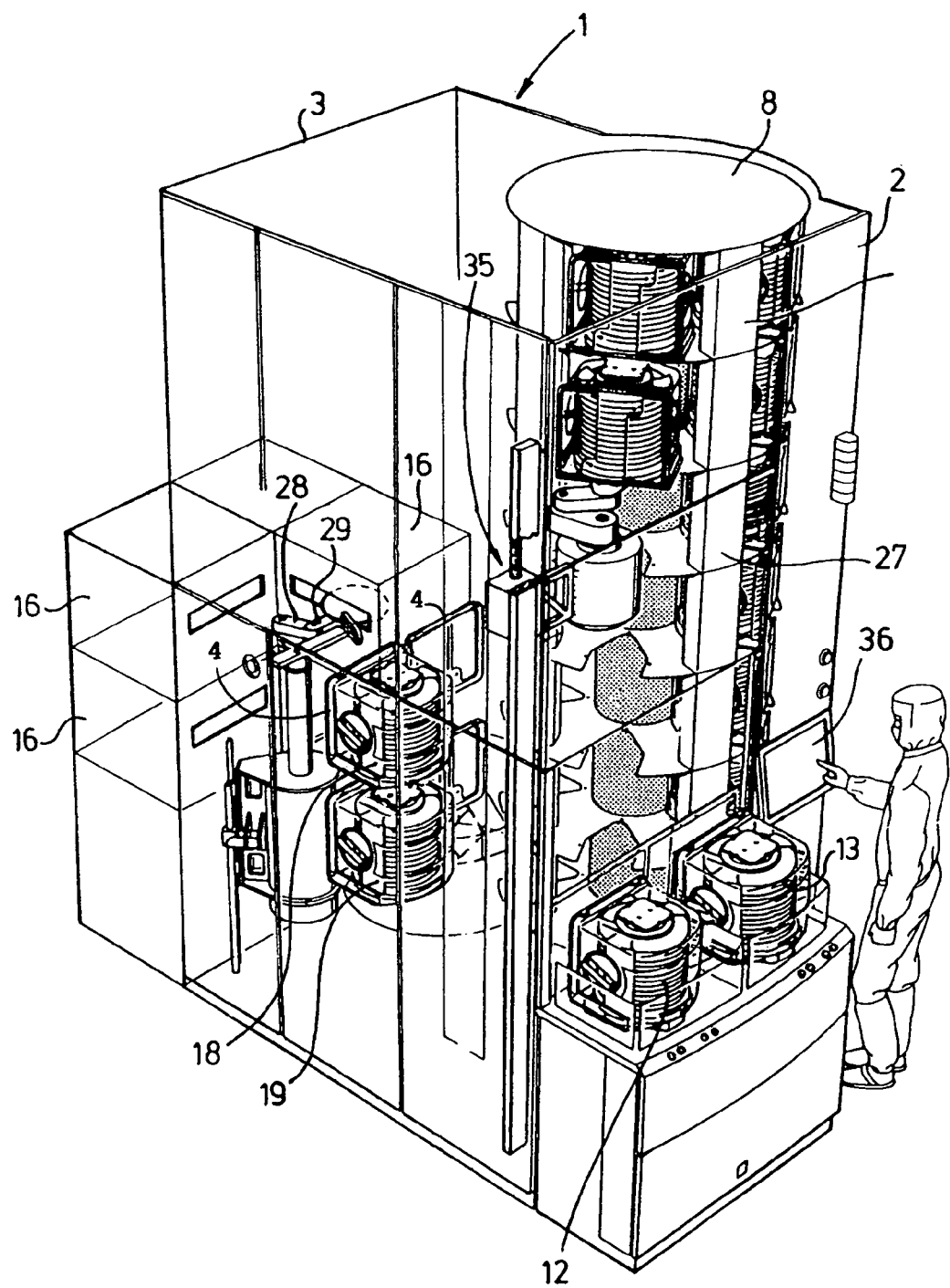
FIG. 2 shows a diagrammatic, perspective view of a sorting/storage device according to the invention.
Figure 3:
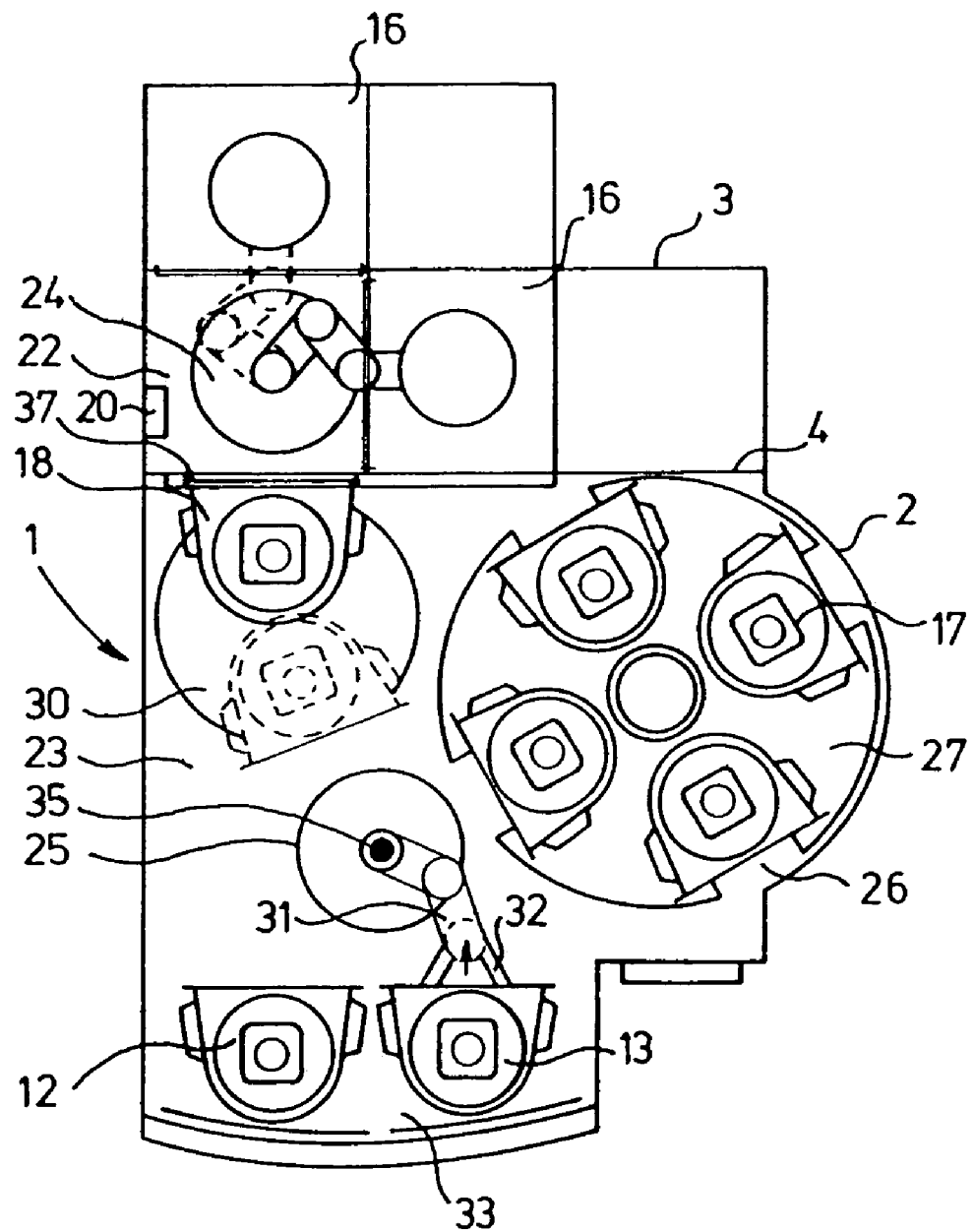
FIG. 3 shows a plan view of the various parts of this device according to the invention.

FIGS. 2 and 3 show the single device according to the present invention which combines the above devices and considerably simplifies the complicated operations while allowing more efficient handling of the wafers on a much smaller surface area.

In these FIGS. 2, 3, a sorting/storage device according to the present invention is denoted by 1. This device is arranged in a housing 2. This housing 2 is preferably itself placed in a chamber which is not shown, such as a clean room.

As can be seen from FIGS. 2 and 3, the housing is provided with a partition 4. Partition 4 provides a separation between chamber 23 and chamber 22. A cassette-handling device 25 such as a robot, and a magazine 8 for cassettes are situated in chamber 23. Communication with chamber 22 is realized via closable opening 37 which is designed in such a manner that, when cassette 18 is placed against it, both this cassette and the said opening 37 are opened. Consequently, it is possible for the wafer-handling device or wafer robot 24 arranged in chamber 22 to collect wafers from the cassette in question or to position them therein. This wafer-handling robot 24 is able to move both in the horizontal plane and in the vertical plane and is controlled by control unit 20. Any desired gas atmosphere can be maintained within a chamber 22, for example a pure nitrogen atmosphere, in order to avoid any action on the wafers, and the number of particles can be reduced still further.

Moreover, one or more measuring stations are situated adjacent to chamber 22. Each measuring station is able to determine one or more different parameters, such as the layer thickness of material which has been deposited on the wafer, the chemical and/or physical state of this material, the number of dust particles on the wafer and the like. As can be seen from FIG. 3, measuring stations may be placed in active connection with the wafer-handling robot at a number of positions. Moreover, it can be seen from FIG. 2 that if the height of the measuring stations is limited, two or more measuring stations can be placed above one another within the reach of the wafer-handling robot.

These cassettes 18 are arranged on a turntable 30. Using cassette-handling device 25, cassettes can be moved from this turntable 30 to store 8. This cassette-handling robot 25 comprises a jointed arm 31 and a height-adjustment mechanism 35. Store 8 comprises a rotatable, cylindrical magazine provided with receptacles 26, at different levels 27, which receive cassettes 17. Cassettes 12, 13, 17 and 18 are, of course, identical. Store 8 is of rotatable design. As a result, and because the cassette robot 25 is vertically adjustable, any cassette can be moved from the store onto the turntable 30 which is designed with two recesses. It will be understood that table 30 may have a greater number of levels.

On entry, the cassettes 12 and 13 are moved into the insertion/removal position 33. As diagrammatically indicated in FIG. 3, it is possible, from this position, for example to place cassette 13 in store 8 or to transfer it directly to turntable 30.

When using so-called FOUPs, i.e. cassettes which normally close off their contents and are opened only on contact with partition 4, chamber 23 may have the same atmosphere as the surroundings, for example clean-room conditions, and does not have to satisfy the higher demands imposed when sorting the wafers for particle concentration and the like.

The device described above functions as follows. If, for example, cassette 13 which is empty is to be provided with a specific sequence of different types of wafers for treatment in, for example, a furnace, it is placed on turntable 30 using cassette-handling robot 25. Following rotation of turntable 30, cassette 13 is situated in the position of cassette 18. It is then opened. Before this, after this or simultaneously, it is ensured that a cassette containing at least one desired wafer is situated at a different level of turntable 30. For this purpose, the top part of turntable 30 can move independently from bottom part of turntable 30. Rotation of turntable 30, like the movement of the sorting device 24, store 8 and cassette-handling device 25, is controlled by control unit 20. Then, the desired wafer is placed in cassette 18 with the aid of wafer-handling device 24. If other wafers are required and are not present in the stock cassette used, this stock cassette is exchanged for another which may come from store 8. In this way, a desired batch is assembled in cassette 18 and is removed again using cassette-handling device 25.

After the treatment has finished, the cassette in question can be placed back on turntable 30 via handling device 25 and a wafer can be fed to either the top or the bottom measuring station 16 with the aid of wafer-handling device 24. In addition to a measuring station, there may also be a station for reading the wafer identification code and one for the wafer orientation. Various types of measurements on various types of test wafers or various types of measurements on the same test wafer are possible.

The present invention considerably limits the logistics of the test wafers, since they no longer have to move along the various measuring stations and the storage/sorting device is multifunctional. In addition to advantages in the area of the housing and the atmosphere present therein, it is also possible to simplify automation, since the number of wafer-/cassette-handling robots can be limited, as can their expensive control unit 20.

Although the invention is described above with reference to a preferred embodiment, it will be understood that numerous amendments can be made to this without departing from the scope of the present claims. For example, it is possible for the storage device to be designed in any other way which is known from the prior art. Moreover, there may be devices for determining the position of the wafer on the wafer-handling robot.

What is claimed is:

1. A device for sorting wafers stored in cassettes comprising:
    a housing;
    a wafer handling device arranged in a chamber configured to be sealed off with respect to the housing, wherein the wafer-handling device accesses a measuring station configured to carry out measurements directly on said wafers;
    a part for receiving at least two closable cassettes arranged in the housing and separated from said chamber by a partition, said part configured to independently position each received cassette against a related closable opening in said partition, wherein through opening of said closable opening said closable cassette is opened when placed against the opening and placed in communication with said chamber so that said wafer handling device can sort wafers by moving the wafers into and out from one cassette and into an other cassette after opening each of said at least two cassettes;
    a store for closable cassettes arranged in the housing; and
    a handling device for closable cassettes arranged in the housing, wherein the store for closable cassettes and the handling device for closable cassettes are separated from the part for receiving at least two cassettes, wherein the part for receiving at least two cassettes comprises a turntable, wherein said turntable comprises two or more levels which are independently rotatable, wherein the turntable is configured to receive one of the at least two cassettes on each of the two or more levels, wherein said turntable is configured to place each of the at least two cassettes in a position against a related closeable opening.

2. The device of claim 1, wherein the device is configured for sorting wafers stored in FOUPs.

3. The device of claim 1, wherein the store for cassettes comprises a rotatable magazine.

4. A method for assembling a batch of wafers in cassettes comprising the steps of:
    placing at least a first and a second closed cassette in a store;
    employing a cassette handling device to select and move a first cassette from the store to a first closable opening in a sealed chamber;
    opening said first closable opening together with said first cassette;
    employing a cassette handling device to select and move a second cassette from the store to a second closable opening in said sealed chamber;
    opening said second closable opening together with said second cassette;
    performing a direct measurement of said wafers in a measuring station; and
    employing a wafer-handling device, provided in said sealed chamber, to transfer wafers to and from the measuring station communicating with said sealed chamber and to sort the wafers by transferring wafers directly between the first cassette and the second cassette,
    wherein employing the cassette handling device to select and move the first cassette comprises:
        moving the first cassette from the store to a recess on a first level of a turntable; and
        rotating the first level of the turntable so as to move the first cassette to the first closable opening; and
    wherein employing the cassette handling device to select and move the second cassette comprises:
        moving the second cassette from the store to a recess on a second level of the turntable; and
        rotating the second level of the turntable independently of the first level so as to move the second cassette to the second closable opening.

5. The method of claim 4, further comprising the step of testing the wafers during sorting the wafers.

* * * * *